United States Patent
Cheng et al.

(10) Patent No.: US 10,446,898 B2
(45) Date of Patent: Oct. 15, 2019

(54) ON-CHIP COPLANAR WAVEGUIDE HAVING A SHIELDING LAYER COMPRISING A CAPACITOR FORMED BY SETS OF INTERDIGITATED FINGERS

(71) Applicant: QUALCOMM Incorporated, San Diego, CA (US)

(72) Inventors: Haitao Cheng, San Diego, CA (US); Zhang Jin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/687,129

(22) Filed: Aug. 25, 2017

(65) Prior Publication Data
US 2019/0006728 A1    Jan. 3, 2019

Related U.S. Application Data

(60) Provisional application No. 62/526,538, filed on Jun. 29, 2017.

(51) Int. Cl.
| | |
|---|---|
| *H01P 3/00* | (2006.01) |
| *H05K 1/02* | (2006.01) |
| *H01P 1/30* | (2006.01) |
| *H01P 11/00* | (2006.01) |

(52) U.S. Cl.
CPC ............. *H01P 3/003* (2013.01); *H01P 1/30* (2013.01); *H01P 11/001* (2013.01); *H05K 1/0227* (2013.01); *H05K 1/0245* (2013.01)

(58) Field of Classification Search
CPC .. H01P 3/003; H01P 3/006; H01P 3/04; H01P 11/001; H05K 1/0227; H01K 1/0245
USPC ........................................................ 333/238
See application file for complete search history.

(56) References Cited

U.S. PATENT DOCUMENTS

| | | | |
|---|---|---|---|
| 6,507,495 B1 * | 1/2003 | Hailey et al. | H05K 1/0216 174/250 |
| 7,626,476 B2 | 12/2009 | Kim et al. | |
| 7,999,361 B1 | 8/2011 | Chen et al. | |
| 8,324,979 B2 | 12/2012 | Cho | |

(Continued)

OTHER PUBLICATIONS

Sharabi S-A., et al., "Extension of 0.18 μm Standard CMOS Technology Operating Range to the Microwave and Millimetre-Wave Regime", University of Glasgow, 2015, pp. 1-204.

(Continued)

*Primary Examiner* — Benny T Lee
(74) *Attorney, Agent, or Firm* — Qualcomm Incorporated/Seyfarth Shaw LLP (57) ABSTRACT

A coplanar waveguide may include a first transmission line extending between a first ground plane and a second ground plane at a first interconnect level. The coplanar waveguide may further include a shielding layer at a second interconnect level. The shielding layer may include a first set of conductive fingers coupled to the first ground plane. The first set of conductive fingers may be interdigitated with a second set of conductive fingers that are coupled to the second ground plane. Only a dielectric layer may be between the first set of conductive interdigitated fingers and the second set of conductive interdigitated fingers. The first ground plane, the second ground plane, the dielectric layer, and the shielding layer may form a capacitor.

16 Claims, 8 Drawing Sheets

(56) References Cited

U.S. PATENT DOCUMENTS

| | | | |
|---|---|---|---|
| 8,901,714 B2 | 12/2014 | Yen et al. | |
| 9,105,634 B2 | 8/2015 | Huang et al. | |
| 2002/0012240 A1* | 1/2002 | Hailey et al. | H05K 1/0216 361/818 |
| 2009/0255720 A1* | 10/2009 | Lu et al. | H05K 1/0253 174/262 |

OTHER PUBLICATIONS

International Search Report and Written Opinion—PCT/US2018/037646—ISA/EPO—dated Aug. 27, 2018.
Konno M., "Ladder Grounded Coplanar Line", Electronics & Communications in Japan, Part II—Electronics, Wiley, Hoboken, NJ, US, Aug. 1, 1997, vol. 80, No. 8, XP000782953, ISSN: 8756-663X, DOI: 10.1002/(SICI)1520-6432 (199708)80:8.

\* cited by examiner

ON-CHIP COPLANAR WAVEGUIDE HAVING A SHIELDING LAYER COMPRISING A CAPACITOR FORMED BY SETS OF INTERDIGITATED FINGERS

CROSS-REFERENCE TO RELATED APPLICATION

The present application claims the benefit of U.S. Provisional Patent Application No. 62/526,538, filed on Jun. 29, 2017, and titled "ON-CHIP COPLANAR WAVEGUIDE (CPW) TRANSMISSION LINE INTEGRATED WITH METAL-OXIDE-METAL (MOM) CAPACITORS," the disclosure of which is expressly incorporated by reference herein in its entirety.

BACKGROUND

Field

The present disclosure relates generally to wireless communication systems, and more specifically, to an on-chip coplanar waveguide (CPW) transmission line integrated with metal-oxide-metal (MOM) capacitors.

Background

Electrical interconnections of active devices may exist at each level of a system hierarchy, ranging from a lowest system level to a highest system level. For example, interconnect layers may connect different devices together on an integrated circuit. As integrated circuits become more complex, more interconnect layers provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

These interconnect layers may provide transmission line structures for interconnecting integrated circuit (IC) devices in high frequency circuit designs. For example, high frequency circuit designs may use a coplanar waveguide as a transmission line for supporting radio frequency (RF) through millimeter-wave frequencies. These high frequency designs may enable millimeter-wave communication systems that replace and/or supplement microstrips with coplanar waveguides for communicating extremely high frequency radio signals.

Traditional coplanar waveguide circuits include a conductor fabricated between two ground planes. The ground planes and the conductor may be fabricated on a surface of a dielectric substrate or other like circuit material. This configuration is referred to as a ground-signal-ground (GSG) transmission line structure. That is, coplanar waveguides include planar transmission line structures composed of various arrays of conductors arranged in the same geometric plane.

A coplanar waveguide includes its principle ground in the form of wide strips adjacent to an active conductor. These transmission line structures may use a ground conductor that is coplanar with the active signal conductor for providing a signal return path. The signal return path may be on the same interconnect (e.g., metallization) layer as the active conductor. Unfortunately, this arrangement, while improving performance, reduces the number of available interconnections because the signal return lines consume routing area.

SUMMARY OF THE DISCLOSURE

A coplanar waveguide may include a first transmission line extending between a first ground plane and a second ground plane at a first interconnect level. The coplanar waveguide may further include a shielding layer at a second interconnect level. The shielding layer may include a first set of conductive fingers coupled to the first ground plane. The first set of conductive fingers may be interdigitated with a second set of conductive fingers that are coupled to the second ground plane. Only a dielectric layer may be between the first set of conductive interdigitated fingers and the second set of conductive interdigitated fingers. The first ground plane, the second ground plane, the dielectric layer, and the shielding layer may form a capacitor.

A method for fabricating a coplanar waveguide may include fabricating a first transmission line extending between a first ground plane and a second ground plane at a first interconnect level. The method may further include fabricating a first set of shield layer fingers interdigitated with a second set of shield layer fingers at a second interconnect level. Only a dielectric layer may be between the first set of shield layer fingers and the second set of shield layer fingers. The method may further include electrically coupling the first set of shield layer fingers to the first ground plane with a first set of vias. The method may further include electrically coupling the second set of shield layer fingers to the second ground plane with a second set of vias.

A coplanar waveguide may include a first means for signal transmission. The first signal transmission means may extend between a first ground plane and a second ground plane at a first interconnect level. The coplanar waveguide may further include a shielding layer at a second interconnect level. The shielding layer may include a first set of conductive fingers coupled to the first ground plane. The first set of conductive fingers may be interdigitated with a second set of conductive fingers coupled to the second ground plane. Only a dielectric layer may be between the first set of conductive interdigitated fingers and the second set of conductive interdigitated fingers. The first ground plane, the second ground plane, the dielectric layer, and the shielding layer may form a capacitor.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION OF THE DISCLOSURE

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Electrical interconnections of active devices may exist at each level of a system hierarchy, ranging from a lowest system level to a highest system level. In particular, interconnect layers may connect different devices together on an integrated circuit (IC). As integrated circuits become more complex, more interconnect layers provide the electrical connections between these devices. More recently, the number of interconnect levels for circuitry has substantially increased due to the large number of devices that are now interconnected in modern mobile radio frequency (RF) devices. The increased number of interconnect levels for supporting the increased number of devices involves more intricate processes.

These interconnect layers may provide transmission line structures for interconnecting IC devices in high frequency circuit designs. These high frequency circuit designs may use a coplanar waveguide as a transmission line for supporting signals from RF through millimeter-wave frequencies. For example, high frequency designs may enable millimeter-wave communication systems that replace and/or supplement microstrips with coplanar waveguides for communicating extremely high frequency radio signals.

Traditional coplanar waveguide circuits include a conductor fabricated between two ground planes. The ground planes and the conductor may be fabricated on a surface of a dielectric substrate or other like circuit material. This configuration is referred to as a ground-signal-ground (GSG) or ground-signal-signal-ground (GSSG) transmission line structure. That is, coplanar waveguides include planar transmission line structures that are composed of various arrays of conductors arranged in the same geometric plane.

A coplanar waveguide includes its principle ground in the form of wide strips adjacent to an active conductor. These transmission line structures use a ground conductor that is coplanar with the signal conductor for providing a signal return path on the same interconnect (e.g., metallization) layer as the active conductor. Unfortunately, this arrangement, while assuring optimum performance, reduces the number of interconnections that can be provided because the signal return lines consume routing area, which is extremely valuable in mobile RF devices.

Passive devices in mobile RF devices may include high performance capacitor components. For example, analog integrated circuits use various types of passive devices, such as integrated capacitors. These integrated capacitors may include metal-oxide-semiconductor (MOS) capacitors, p-n junction capacitors, metal-insulator-metal (MIM), poly-to-poly capacitors, metal-oxide-metal (MOM) capacitors, and other like capacitor structures. Capacitors are generally passive elements used in integrated circuits for storing an electrical charge. For example, parallel plate capacitors are often made using plates or structures that are conductive with an insulating material between the plates. The amount of storage, or capacitance, for a given capacitor is contingent upon the materials of the plates and the insulator, the area of the plates, and the spacing between the plates. The insulating material is often a dielectric material.

These parallel plate capacitors may take up a large area on a semiconductor chip because many designs place the capacitor over the substrate of the chip. Unfortunately, this approach takes up a large amount of substrate area, which reduces the available area for active devices. Another approach is to create a vertical structure, which may be known as a vertical parallel plate (VPP) capacitor. The VPP capacitor structure may be created through stacking of the interconnect layers on a chip.

VPP capacitors structures, however, have lower capacitive storage, or lower "density," in that these structures do not store much electrical charge. In particular, the interconnect and via layer interconnect traces used to fabricate VPP capacitors may be very small in size. The spacing between the interconnect and via layer conductive traces in VPP structures is limited by design rules, which often results in a large area for achieving certain desired capacitance for such structures. Although described as "vertical," these structures can be in any direction that is substantially perpendicular to the surface of the substrate, or at other angles that are not substantially parallel to the substrate.

A MOM capacitor is one example of a VPP capacitor. MOM capacitors are one of the most widely used capacitors due to their beneficial characteristics. In particular, MOM capacitors may be high quality capacitors in semiconductor processes without incurring the cost of an extra processing step relative to other capacitor structures. MOM capacitor structures realize capacitance by using the fringing capacitance produced by sets of interdigitated fingers. That is, MOM capacitors harness lateral capacitive coupling between plates formed by metallization layers and wiring traces.

Various aspects of the disclosure integrate a ground-signal-ground (GSG) or a ground-signal-signal-ground (GSSG) transmission line structure with a capacitor (e.g., a MOM capacitor). The process flow for fabrication of these MOM capacitors may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably unless such interchanging would tax credulity.

As described, the back-end-of-line interconnect layers may refer to the conductive interconnect layers for electrically coupling to front-end-of-line active devices of an integrated circuit. The back-end-of-line interconnect layers may electrically couple to middle-of-line interconnect layers for, for example, connecting to an oxide diffusion layer of an integrated circuit. A back-end-of-line first via may connect to others of the back-end-of-line interconnect layers.

An on-chip transmission line may be used in a millimeter-wave radio frequency integrated circuit (RFIC) for interconnection as well as power delivery. These on-chip transmission lines, unfortunately, occupy a substantial portion of on-chip area because a signal line is between ground lines. According to aspects of the present disclosure, an area for shielding the signal line is used to form capacitors (e.g., MOM capacitors). That is, unused area that is occupied for shielding the signal line is repurposed to form capacitors, while also shielding the transmission line. The ground lines remain well connected at an RF frequency through the capacitor, while remaining isolated at lower frequencies.

A coplanar waveguide may include a first transmission line that extends between a first ground plane and a second ground plane at a first interconnect level. The waveguide also includes a shielding layer at a second interconnect level. The shielding layer may include a first set of conductive fingers coupled to the first ground plane and interdigitated with a second set of conductive fingers coupled to the second ground plane. A dielectric layer may be between the first set and the second set of interdigitated fingers. The dielectric layer, without additional conductive components, is between the fingers. The first ground plane, the second ground plane, the dielectric layer, and the shielding layer may form a capacitor.

Figure 1:
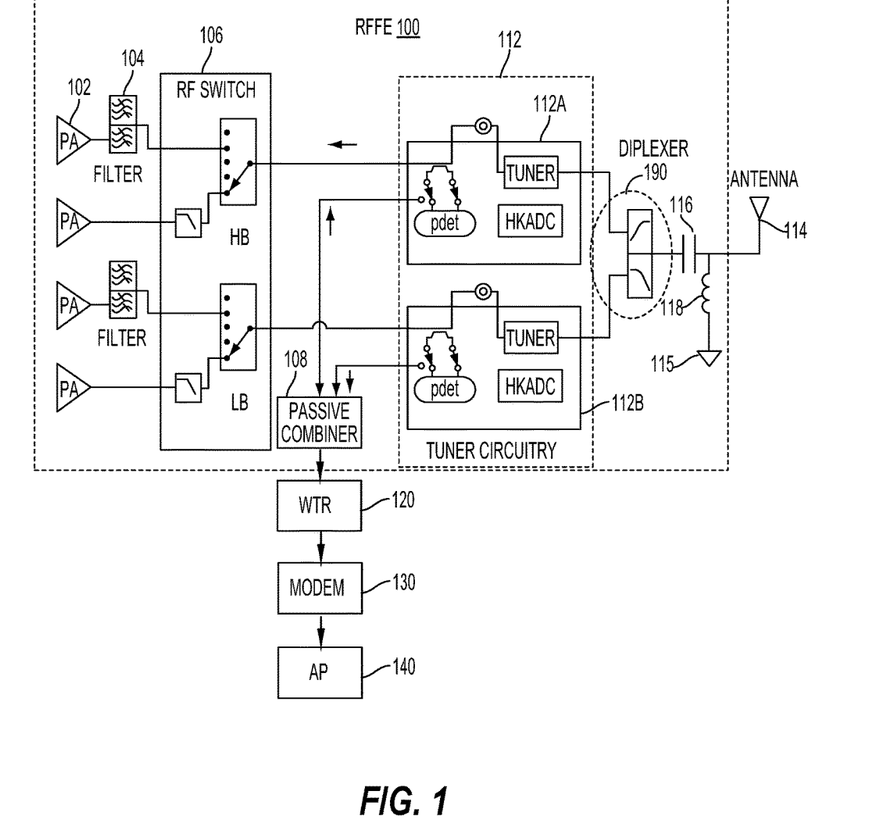
FIG. 1 is a schematic diagram of a radio frequency (RF) front end (RFFE) module employing passive devices.

FIG. 1 is a schematic diagram of a radio frequency (RF) front end (RFFE) module 100 employing passive devices including a capacitor 116 that could be integrated with a coplanar waveguide transmission line. The RF front end module 100 includes power amplifiers (PA) 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The radio frequency (RF) front end module 100 also includes tuner circuitry 112 (e.g., first tuner circuitry 112A and second tuner circuitry 112B), the diplexer 190, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 190 is between the tuner component of the tuner circuitry 112 and the capacitor 116, the inductor 118, and the antenna 114. The diplexer 190 may be placed between the antenna 114 and the tuner circuitry 112 to provide high system performance from the RF front end module 100 to a chipset including the wireless transceiver 120, the modem 130, and the application processor 140. The diplexer 190 also performs frequency domain multiplexing on both high band (HB) frequencies and low band (LB) frequencies. After the diplexer 190 performs its frequency multiplexing functions on the input signals, the output of the diplexer 190 is fed to an optional LC (inductor/capacitor) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2A:
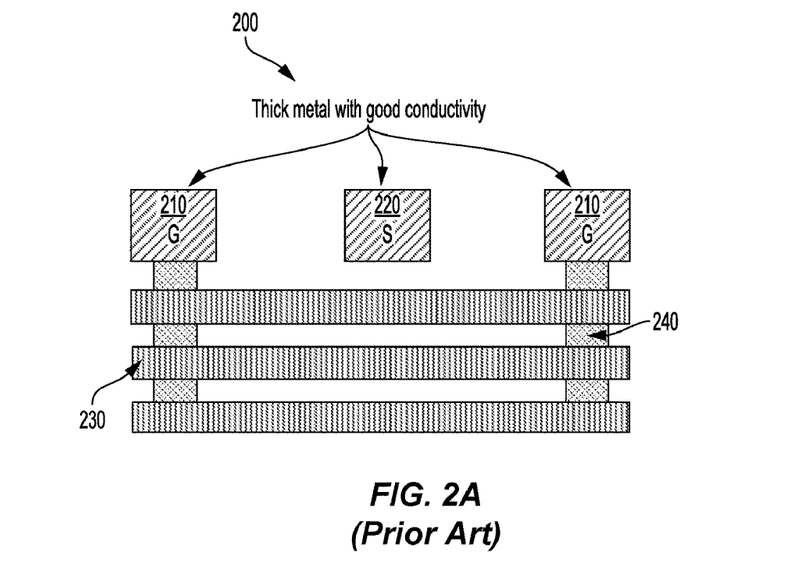
FIGS. 2A and 2B illustrate a conventional ground-signal-ground (GSG) transmission line structure.
Figure 2B:
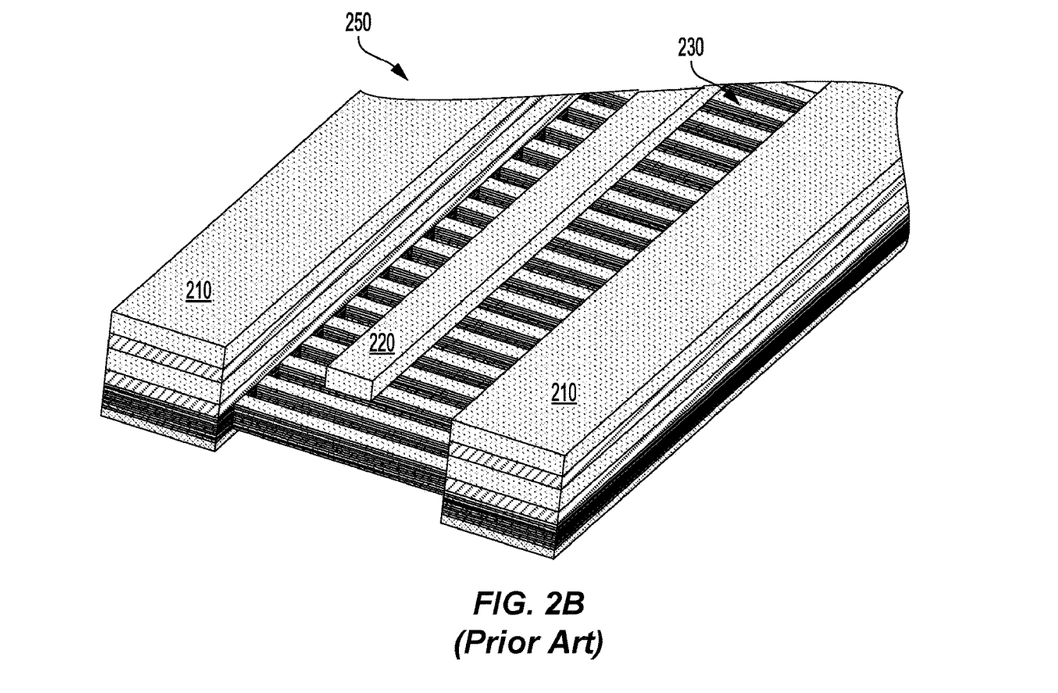

FIGS. 2A and 2B are schematic diagrams of a conventional coplanar waveguide transmission line structure in a ground-signal-ground (GSG) configuration. Representatively, FIG. 2A shows a coplanar waveguide transmission line structure 200 including an active conductor 220 (S) between two ground planes 210 (G). The two ground planes 210 and the active conductor 220 may be fabricated by thick metal with good conductivity on a surface of a dielectric substrate or other like circuit material (not shown). This configuration is referred to as a ground-signal-ground (GSG) transmission line structure. That is, coplanar waveguides include planar transmission line structures that are composed of various arrays of conductors in the same geometric plane and shielded by, for example, a shielding layer 230. The shielding layer 230 may be coupled to the two ground planes 210 through vias 240.

FIG. 2B shows a 3D view 250 of a conventional coplanar waveguide that includes its principle ground in the form of wide strips (e.g., 210) adjacent to an active conductor (e.g., 220). These transmission line structures use a ground conductor that is coplanar with the signal conductor for providing a signal return path on the same interconnect (e.g., metallization) layer as the active conductor. Unfortunately, this arrangement, while assuring high performance, reduces the number of interconnections that can be provided because the signal return lines consume routing area.

Figure 3:
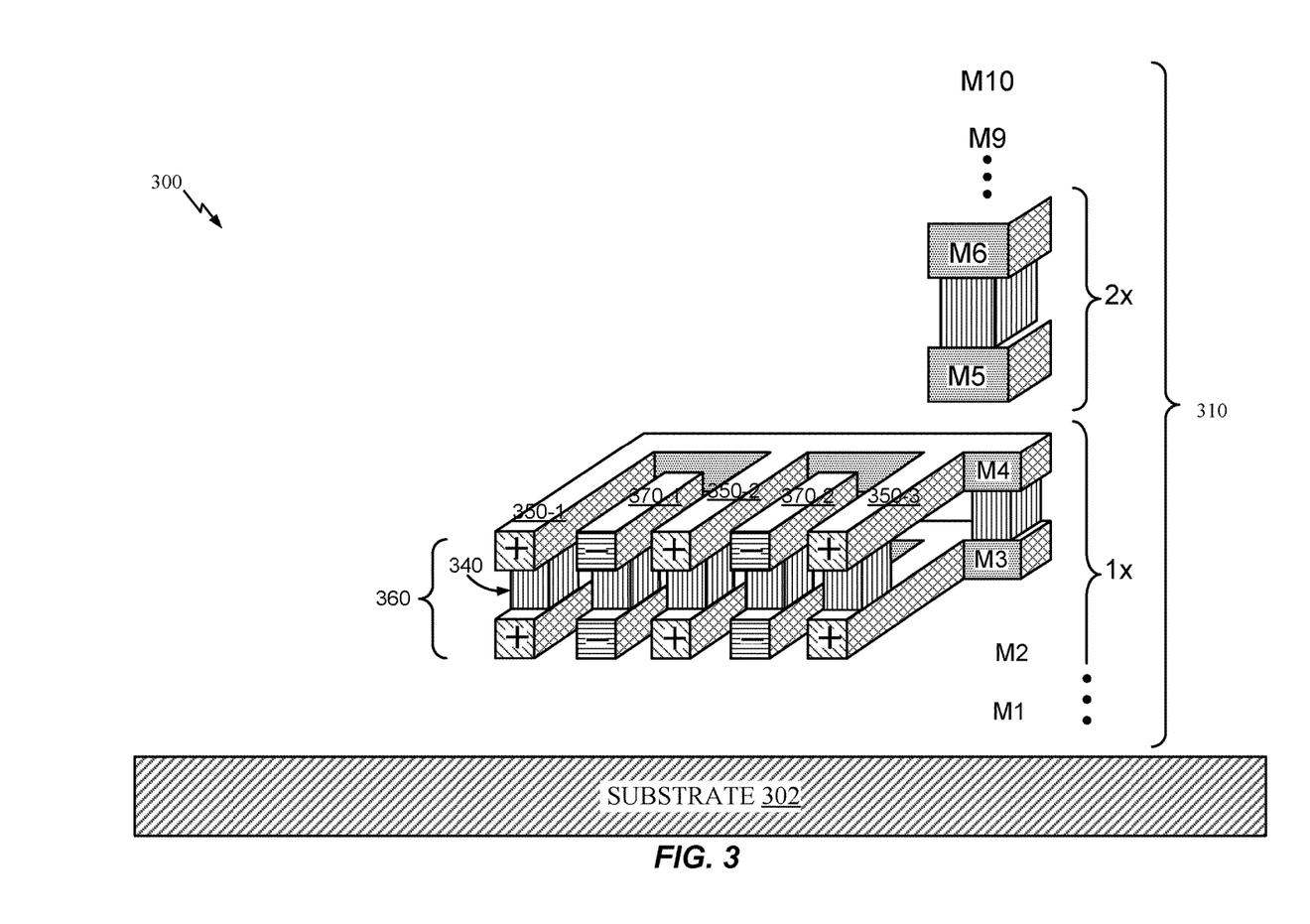
FIG. 3 is a cross section illustrating an integrated circuit (IC) device including an interconnect stack that contains metal-oxide-metal (MOM) capacitor structures.

As further shown in FIG. 2A, the shielding layer 230, which is coupled to the two ground planes 210 through vias 240, also consumes space that is extremely valuable in mobile radio frequency (RF) devices. An on-chip transmission line, such as the coplanar waveguide transmission line structure 200, may be used in a millimeter-wave radio frequency integrated circuit (RFIC) for interconnection as well as power delivery. These on-chip transmission lines, unfortunately, occupy a substantial portion of on-chip area when a signal line is between ground lines. According to aspects of the present disclosure, the shielding layer 230 may be reconfigured to incorporate a passive device, such as a capacitor, as shown in FIG. 3.

Capacitors are widely used in analog integrated circuits. FIG. 3 is a block diagram illustrating a cross section of an analog integrated circuit (IC) device 300 including an interconnect stack 310. The interconnect stack 310 of the IC device 300 includes multiple conductive interconnect layers (e.g., M1, M2, M3, M4, M5, M6, . . . M9, M10) on a semiconductor substrate (e.g., a diced silicon wafer) 302. In this example, M5 and M6 BEOL interconnect layers are twice (2×) the thickness of M3 and M4 interconnect layers (1×). The semiconductor substrate 302 supports metal-oxide-metal (MOM) capacitors 360. In this example, the MOM capacitors 360 are formed in the M3 and M4 interconnect layers. The MOM capacitors 360 are formed from lateral conductive fingers of different polarities (e.g., + and −) using the conductive interconnect layers (e.g., M3 and M4) of the interconnect stack 310. A dielectric (not shown) is between the conductive fingers. In aspects of the present disclosure, only the dielectric layer is between the conductive fingers.

In this example, the MOM capacitors 360 are formed within the lower conductive interconnect layers (e.g., M1, M2, M3, M4) of the interconnect stack 310. The lower conductive interconnect layers of the interconnect stack 310 have smaller interconnect widths and spaces. For example, for signal lines, the dimensions of the lower conductive interconnect layers may have widths and spaces at least 10 times smaller than the top conductive interconnect layers. The small interconnect widths and spaces of the lower conductive interconnect layers enable the formation of MOM capacitors with increased capacitive density. As shown in FIG. 3, MOM capacitors 360 make use of a lateral (intra layer) capacitive coupling 340 between fingers (e.g., 350-1, 350-2, 350-3, 370-1, 370-2) formed by standard metallization of the conductive interconnects (e.g., wiring lines and vias).

In aspects of the present disclosure, a coplanar waveguide may include a first transmission line that extends between a first ground plane and a second ground plane at a first interconnect level. The waveguide also includes a shielding layer at a second interconnect level. The shielding layer may include a first set of conductive fingers (e.g., 350-1, 350-2, 350-3) coupled to the first ground plane and interdigitated with a second set of conductive fingers (e.g., 370-1, 370-2) coupled to the second ground plane. A dielectric material lies between the interdigitated fingers. The first ground plane, the second ground plane, and the shielding layer may form a MOM capacitor. The MOM capacitor may additionally provide shielding for the transmission line. The MOM capacitor in the shielding layer of the transmission line structure is further described in FIGS. 4A and 4B.

Figure 4A:
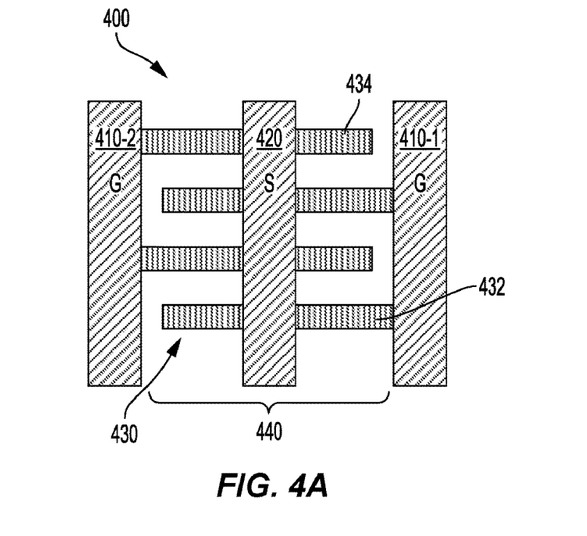
FIGS. 4A and 4B illustrate coplanar waveguide transmission line structures with a capacitor according to aspects of the present disclosure.
Figure 4B:
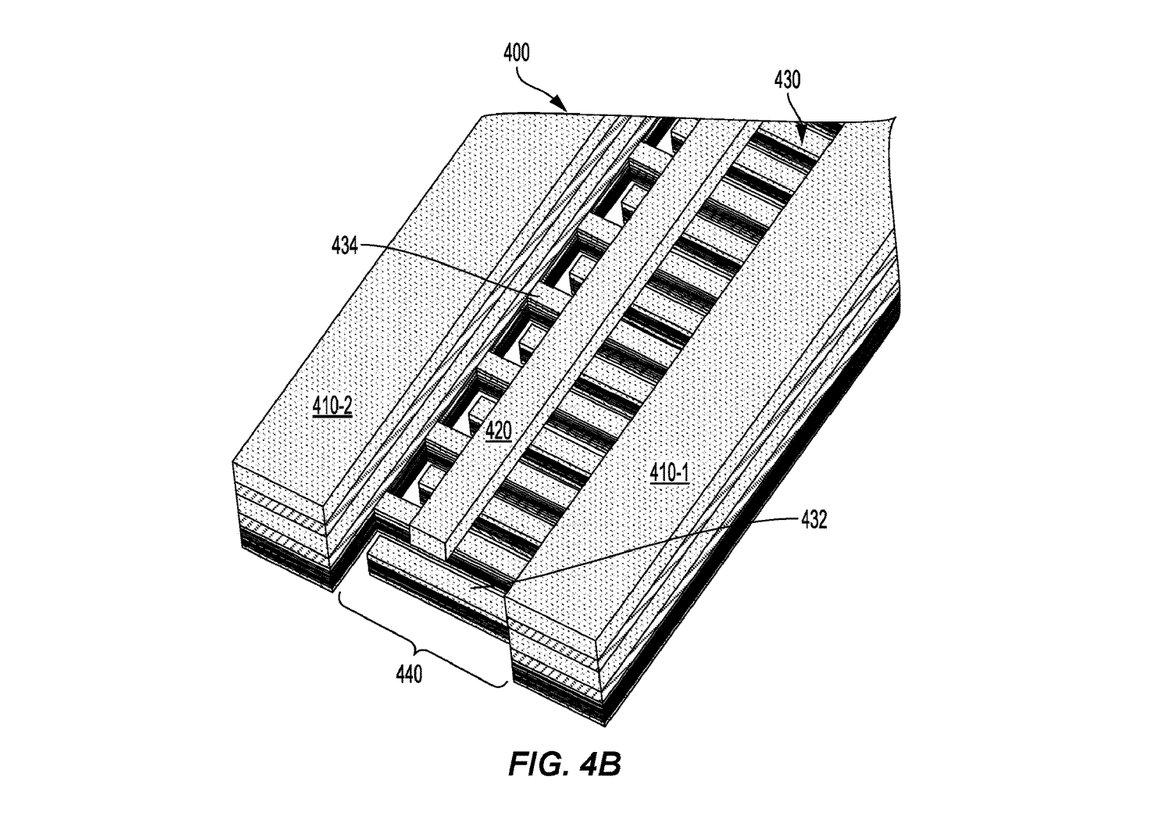

FIGS. 4A and 4B illustrate coplanar waveguide transmission line structures with capacitors according to aspects of the present disclosure. For example, the coplanar waveguide transmission line structures may be ground-signal-ground (GSG) transmission line structures.

Referring to FIG. 4A, a coplanar waveguide transmission line structure 400 includes a capacitor 440. According to aspects of the present disclosure, the coplanar waveguide transmission line structure 400 may be on-chip or on a printed circuit board (PCB). The coplanar waveguide transmission line structure 400 may include a signal line 420 (e.g., a first signal transmission line (S)) extending between ground planes (e.g., a first ground plane 410-1 (G) and a second ground plane 410-2 (G)). For example, the signal line 420 may communicate an RF signal and may be fabricated at an upper interconnect layer (e.g., metal 7 (M7) or metal 8 (M8)), e.g. see FIG. 3. Communication of the RF signal through the upper interconnect layers (e.g., M7/M8) ensures reduced RF signal loss and improved RF signal integrity.

In accordance with aspects of the present disclosure, the coplanar waveguide transmission line structure 400 may also include a shielding layer 430. For example, the shielding layer 430 may include conductive traces (e.g., metal or polysilicon). The shielding layer 430 may include a first set of conductive fingers 432 interdigitated with a second set of conductive fingers 434. In this example, the shielding layer 430 is fabricated at a lower interconnect layer (e.g., metal 1 (M1) or a middle-of-line (MOL) interconnect layer (M0) of polysilicon, as shown in FIG. 5B). The first set of conductive fingers 432 are coupled to the first ground plane 410-1 (G). In addition, the second set of conductive fingers 434 are coupled to the second ground plane 410-2 (G). In this example, each of the first set of conductive fingers 432 and the second set of conductive fingers 434 extend past the signal line 420 (S).

According to additional aspects of the present disclosure, a dielectric layer (not shown) may be between the first set of conductive fingers 432 and the second set of conductive fingers 434 that are interdigitated to form the capacitor 440. The first set of conductive fingers 432 may be coupled to the first ground plane 410-1 (G) through a first set of vias (not shown). In addition, the second set of conductive fingers 434 may be coupled to the second ground plane 410-2 (G) through a second set of vias (not shown). For example, the vias may be fabricated at interconnect levels below the ground planes 410-1 (G) and 410-2 (G), for example, at a same level as the first set of conductive fingers 432 and the second set of conductive fingers 434.

According to aspects of the present disclosure, the ground planes (e.g., 410-1, 410-2), the dielectric layer, and the shielding layer 430 may form the capacitor 440. For example, the capacitor 440 may be a MOM (metal-oxide-metal) capacitor formed in the shielding layer 430 of an RF signal path. The capacitor 440 at the shielding layer 430 may also provide shielding for the signal line 420. The ground planes 410-1 (G) and 410-2 (G) may remain well connected at an RF frequency through the capacitor 440, while remaining isolated at lower frequencies.

FIG. 4B illustrates a 3D view of the coplanar waveguide transmission line structure 400 of FIG. 4A. As described above, the coplanar waveguide transmission line structure 400 may include the signal line 420 between ground planes (e.g., 410-1, 410-2). The signal line 420 may be at a first interconnect level (e.g., M7/M8 shown in FIG. 5B). The shielding layer 430 may be at a second interconnect level (e.g., M1/M0 shown in FIG. 5B), below the first interconnect level. The capacitor 440 may be formed from the first set of conductive fingers 432 and the second set of conductive fingers 434 interdigitated to capture fringe capacitance.

Figure 5A:
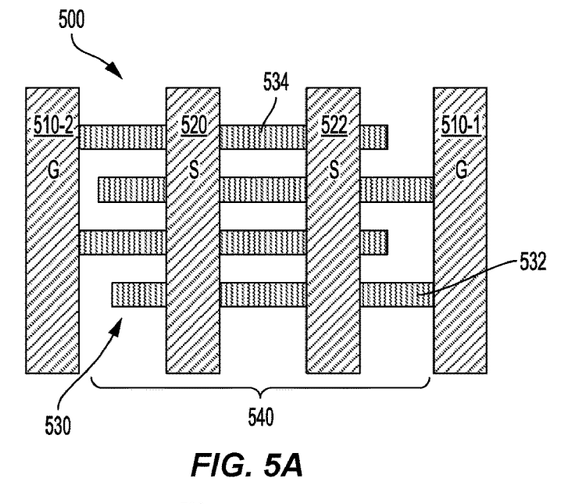
FIGS. 5A and 5B illustrate coplanar waveguide transmission line structures with a capacitor according to aspects of the present disclosure.
Figure 5B:
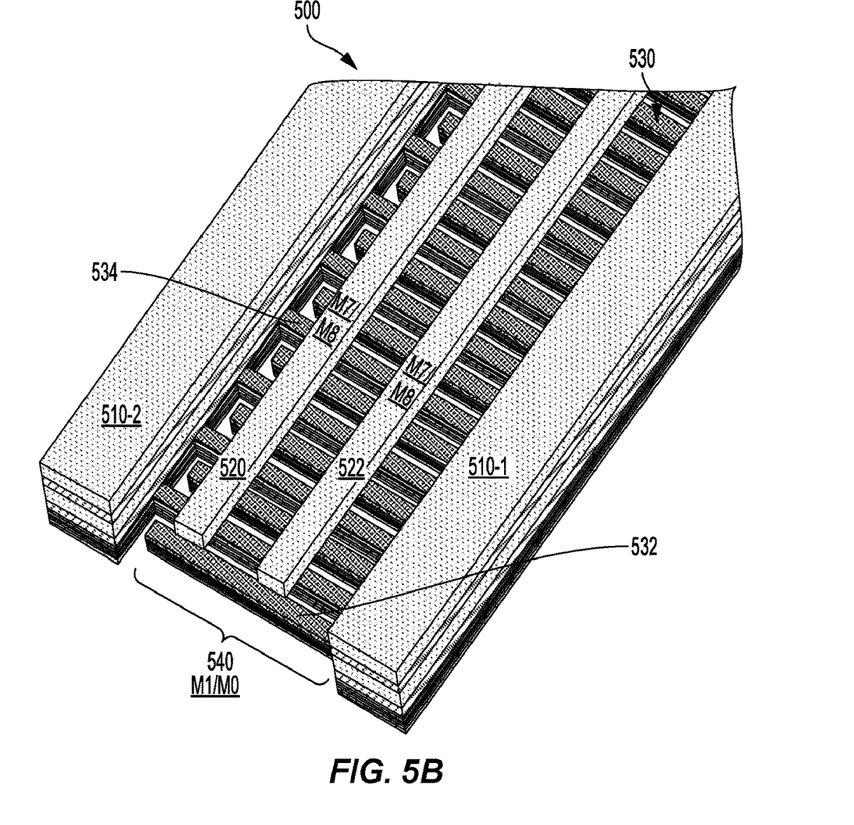

FIGS. 5A and 5B illustrate coplanar waveguide transmission line structures with capacitors, according to aspects of the present disclosure. For example, the coplanar waveguide transmission line structures may be ground-signal-signal-ground (GSSG) transmission line structures.

Referring to FIG. 5A, a coplanar waveguide transmission line structure 500 includes a capacitor 540, according to aspects of the present disclosure. For example, the coplanar waveguide transmission line structure 500 may include a first signal line 520 (e.g., a first signal transmission line (S)) and a second signal line 522 (e.g., a second signal transmission line (S)) between a ground plane (e.g., a first ground plane 510-1 (G) and a second ground plane 510-2 (G)). The first signal line 520 (S) and the second signal line 522 (S) may be for differential signals. The shielding layer 530 may include a first set of conductive fingers 532 and a second set of conductive fingers 534. In this configuration, the first set of conductive fingers 532 are coupled to the first ground plane 510-1 (G). In addition, the second set of conductive fingers 534 are coupled to a second ground plane 510-2 (G), and each may extend past both the first signal line 520 (S) and the second signal line 522 (S).

FIG. 5B illustrates a 3D view of the coplanar waveguide transmission line structure 500 of FIG. 5A. In accordance with aspects of the present disclosure, the first signal line 520 and the second signal line 522 may be at a first interconnect level (e.g., M7/M8). The shielding layer 530 may be at a second interconnect level (e.g., M1/M0), below the first interconnect level. The capacitor 540 (e.g., a MOM capacitor) may be formed from the first set of conductive fingers 532 interdigitated with the second set of conductive fingers 534. In this configuration, the capacitor 540 may be wider than the capacitor 440 as shown in FIGS. 4A and 4B because the first set of conductive fingers 532 and the second set of conductive fingers 534 extend farther past both the first signal line 520 and the second signal line 522 relative to the first ground plane 510-1 and second ground plane 510-2, respectively. According to aspects of the present disclosure, more than two signal lines may be included. For example, a third signal line may be included in addition to the first signal line 520 and the second signal line 522.

An on-chip transmission line, including MOM capacitors in the shielding layer, may enable millimeter-wave radio frequency integrated circuit (RFIC) applications for interconnection to deliver power. According to aspects of the present disclosure, MOM capacitors are formed in an area of the shielding layer for shielding the signal line(s). These capacitors serve the dual purpose of storing energy and shielding the signal line(s). The ground lines remain well connected at RF frequencies through the MOM capacitor, while remaining isolated at lower frequencies.

Figure 6:
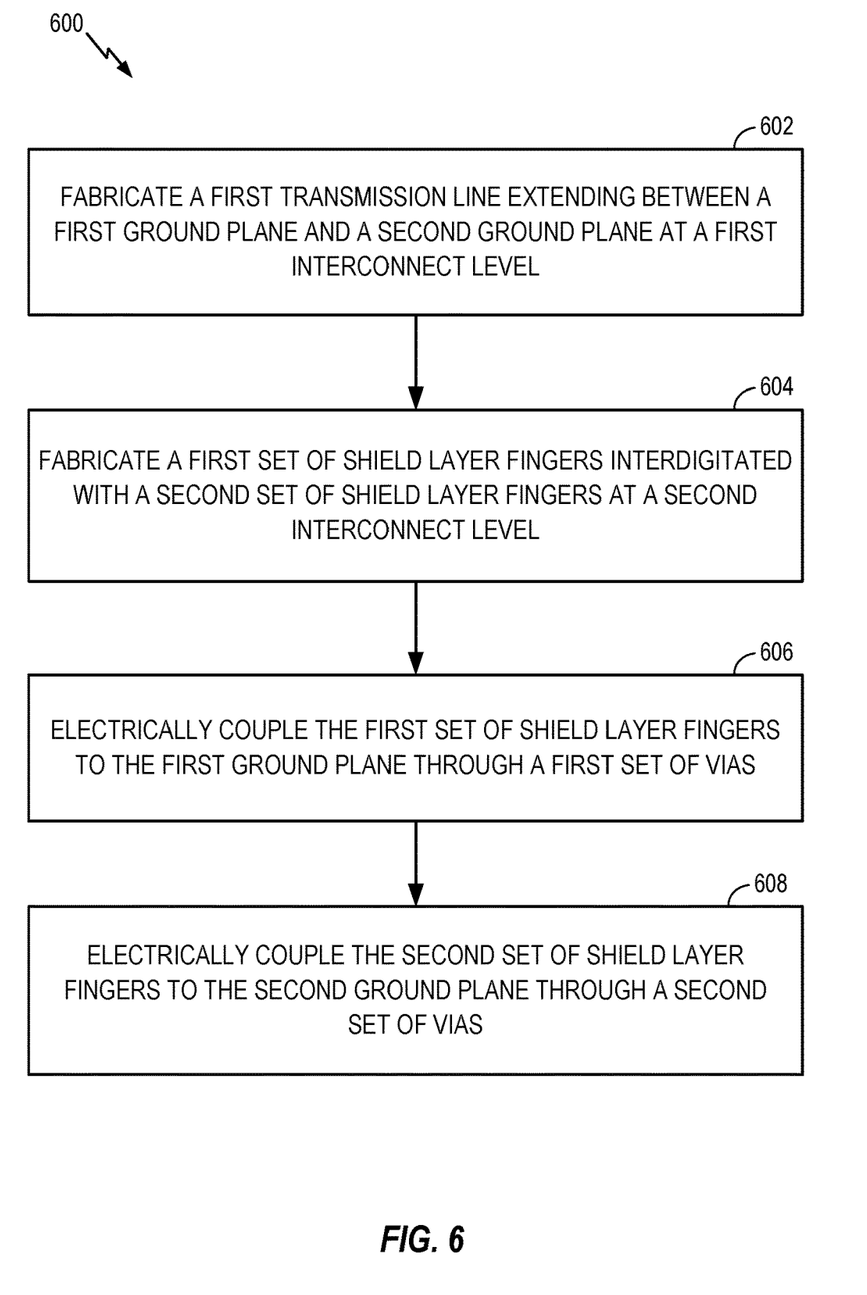
FIG. 6 is a process flow diagram illustrating a method for integrating a coplanar waveguide transmission line structure with a capacitor according to an aspect of the present disclosure.

FIG. 6 is a process flow diagram illustrating a method 600 for fabricating a coplanar waveguide according to an aspect of the present disclosure. In block 602, a first transmission line extending between a first ground plane and a second ground plane is fabricated at a first interconnect level, for example, as shown in FIGS. 4A, 4B, 5A, and 5B. In block 604, a first set of shield layer fingers are fabricated and interdigitated with a second set of shield layer fingers at a second interconnect level. The first set of shield layer fingers and the second set of shield layer fingers may be the first set of conductive fingers 432 and the second set of conductive fingers 434, as shown in FIGS. 4A and 4B. Dielectric material may be deposited between the interdigitated fingers. In block 606, the first set of shield layer fingers are electrically coupled to the first ground plane through a first set of vias. In block 608, the second set of shield layer fingers are electrically coupled to the second ground plane through a second set of vias.

According to a further aspect of the present disclosure, a coplanar waveguide is described. In one configuration, the coplanar waveguide includes first means for transmission and second means for transmission. In one configuration, the first transmission means may be the first signal line 520, as shown, for example, in FIGS. 5A and 5B. In one configuration, the second transmission means may be the second signal line 522, as shown, for example, in FIGS. 5A and 5B. In another aspect, the aforementioned means may be any structure or any material configured to perform the functions recited by the aforementioned means.

Figure 7:
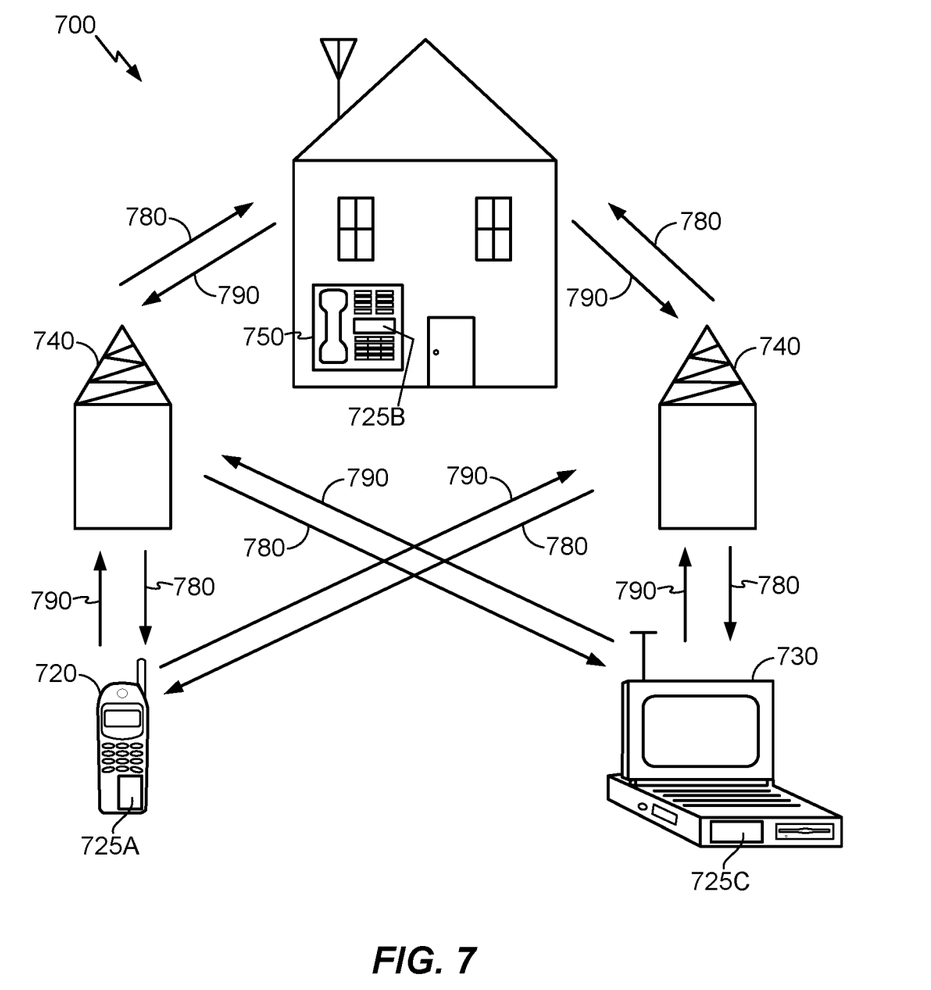
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed coplanar waveguide. It will be recognized that other devices may also include the disclosed coplanar waveguide, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as a meter reading equipment, or other device that stores or retrieves data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed coplanar waveguide.

Figure 8:
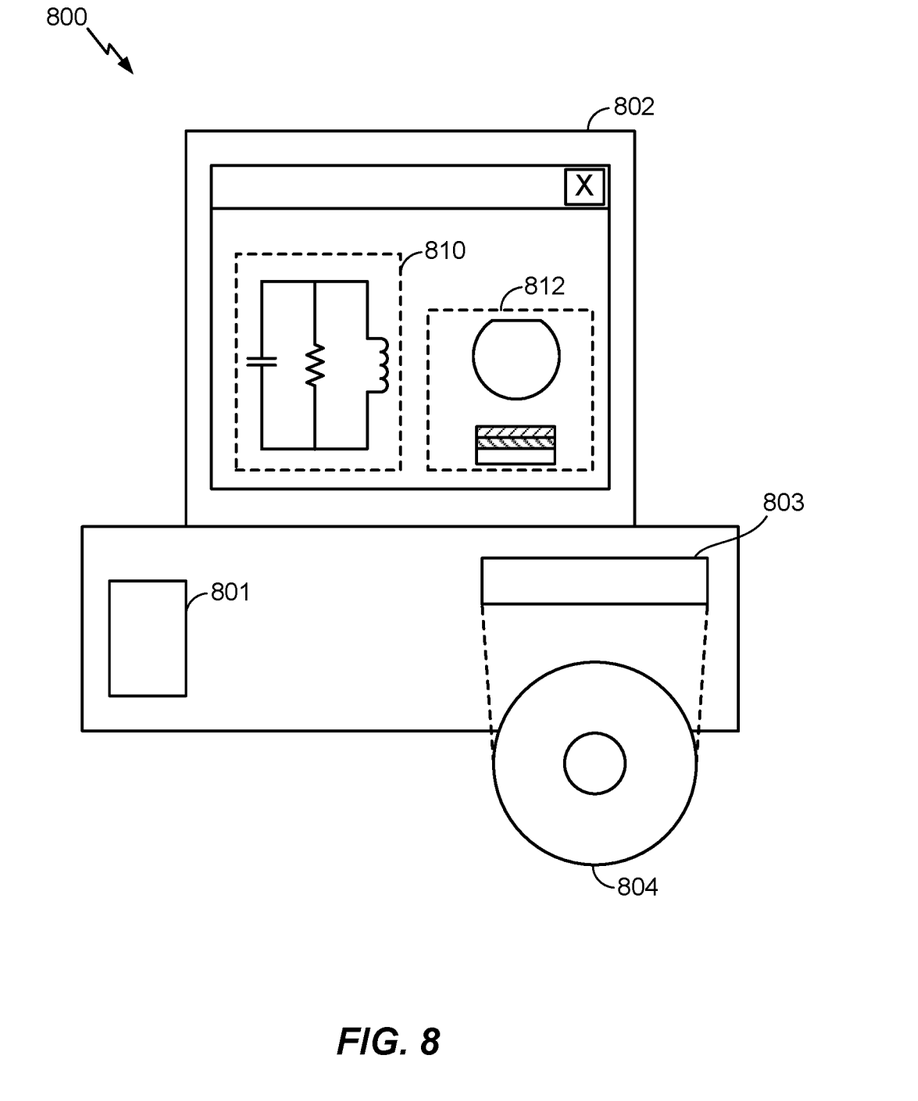
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the coplanar waveguide disclosed above. A design workstation 800 includes a hard disk 801 containing operating system software, support files, and design software. The design workstation 800 also includes a display 802 to facilitate design of a circuit 810 or a coplanar waveguide 812. A storage medium 804 is provided for tangibly storing the design of the circuit 810 or the coplanar waveguide 812. The design of the circuit 810 or the coplanar waveguide 812 may be stored on the storage medium 804 in a file format such as a graphic data system format (GDSII) or an open ASCII vector format for 2D binary images (GERBER). The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit 810 or the coplanar waveguide 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A coplanar waveguide comprising:
   a first signal transmission line extending in a direction parallel to and between a first ground plane and a second ground plane at a first interconnect level; and
   a shielding layer at a second interconnect level below the first interconnect level, the shielding layer comprising a first set of conductive fingers oriented orthogonal to the first ground plane and interdigitated with a second set of conductive fingers oriented orthogonal to the second ground plane, and only a dielectric layer between the first set of conductive interdigitated fingers and the second set of conductive interdigitated fingers, the first ground plane, the second ground plane, the dielectric layer, and the shielding layer comprising a capacitor, in which the first set of conductive fingers and the second set of conductive fingers of the shielding layer comprise polysilicon traces.

2. The coplanar waveguide of claim 1, integrated into a mobile phone, a set top box, a music player, a video player, an entertainment unit, a navigation device, a computer, a hand-held personal communication systems (PCS) unit, a portable data unit, and/or a fixed location data unit.

3. The coplanar waveguide of claim 1, further comprising a second signal transmission line between the first signal transmission line and one of the first ground plane and the second ground plane.

4. The coplanar waveguide of claim 1, in which the coplanar waveguide is on-chip or on a printed circuit board (PCB).

5. The coplanar waveguide of claim 1, in which the first set of conductive fingers are coupled to the first ground plane through a first set of vias, and the second set of conductive fingers are coupled to the second ground plane through a second set of vias.

6. The coplanar waveguide of claim 1, in which the capacitor comprises a metal-oxide-metal (MOM) capacitor.

7. A method for fabricating a coplanar waveguide, comprising:
   fabricating a first signal transmission line extending in a direction parallel to and between a first ground plane and a second ground plane at a first interconnect level;
   fabricating a first set of shield layer fingers interdigitated with a second set of shield layer fingers at a second interconnect level below the first interconnect level, with only a dielectric layer between the first set of shield layer fingers and the second set of shield layer fingers, in which the first set of shield layer fingers and the second set of shield layer fingers are fabricated by depositing polysilicon traces;
   electrically coupling the first set of shield layer fingers oriented orthogonal to the first ground plane with a first set of vias; and
   electrically coupling the second set of shield layer fingers oriented orthogonal to the second ground plane with a second set of vias.

8. The method of claim 7, further comprising fabricating a second signal transmission line between the first signal transmission line and one of the first ground plane and the second ground plane.

9. The method of claim 7, in which the coplanar waveguide is integrated into a mobile phone, a set top box, a music player, a video player, an entertainment unit, a navigation device, a computer, a hand-held personal communication systems (PCS) unit, a portable data unit, and/or a fixed location data unit.

10. A coplanar waveguide comprising:
    first means for signal transmission, extending in a direction parallel to and between a first ground plane and a second ground plane at a first interconnect level; and
    a shielding layer at a second interconnect level below the first interconnect level, the shielding layer comprising a first set of conductive fingers oriented orthogonal to the first ground plane and interdigitated with a second set of conductive fingers oriented orthogonal to the second ground plane, and only a dielectric layer between the first set of conductive interdigitated fingers and the second set of conductive interdigitated fingers, the first ground plane, the second ground plane, the dielectric layer, and the shielding layer comprising a capacitor, in which the first set of conductive fingers and the second set of conductive fingers of the shielding layer comprise polysilicon traces.

11. The coplanar waveguide of claim 10, integrated into a mobile phone, a set top box, a music player, a video player, an entertainment unit, a navigation device, a computer, a hand-held personal communication systems (PCS) unit, a portable data unit, and/or a fixed location data unit.

12. The coplanar waveguide of claim 10, in which the capacitor comprises a metal-oxide-metal (MOM) capacitor.

13. The coplanar waveguide of claim 10, in which the first set of conductive fingers are coupled to the first ground plane through a first set of vias, and the second set of conductive fingers are coupled to the second ground plane through a second set of vias.

14. The coplanar waveguide of claim 10, further comprising second means for signal transmission in a direction parallel to and between the first signal transmission means and one of the first ground plane and the second ground plane.

15. The coplanar waveguide of claim 14, in which the first signal transmission means and the second signal transmission means transmit differential signals.

16. The coplanar waveguide of claim 10, in which the coplanar waveguide is on-chip or on a printed circuit board (PCB).

* * * * *